United States Patent [19]

Shaffer

[11] Patent Number: 4,884,788
[45] Date of Patent: Dec. 5, 1989

[54] BORON NITRIDE CONTAINING VESSEL HAVING A SURFACE COATING OF TITANIUM IRON-SILICON THEREON

[75] Inventor: Gregory W. Shaffer, Brunswick, Ohio

[73] Assignee: Union Carbide Corporation, Danbury, Conn.

[21] Appl. No.: 180,578

[22] Filed: Apr. 12, 1988

[51] Int. Cl.$^4$ ............................................... C21B 3/00
[52] U.S. Cl. .................................... 266/275; 266/280
[58] Field of Search ...................... 266/275, 280, 286; 432/264, 265

[56] References Cited

U.S. PATENT DOCUMENTS

| | | | |
|---|---|---|---|
| 3,724,996 | 4/1973 | Montgomery | 432/264 |
| 3,730,507 | 5/1973 | Montgomery | 266/275 |
| 4,029,466 | 6/1977 | Ishii et al. | 266/275 |

Primary Examiner—S. Kastler
Attorney, Agent, or Firm—Cornelius F. O'Brien

[57] ABSTRACT

The invention relates to a vessel for evaporating molten metal, such as aluminum, in which the vessel comprises boron nitride with or without a compatible refractory material and said vessel having on at least a portion of its surface a coating of titanium-iron-silicon which can easily and effectively be wetted by the molten metal.

8 Claims, 1 Drawing Sheet

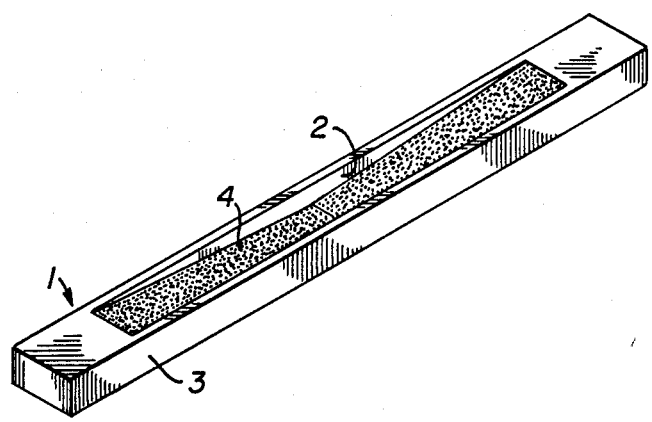

BORON NITRIDE CONTAINING VESSEL HAVING A SURFACE COATING OF TITANIUM IRON-SILICON THEREON

FIELD OF THE INVENTION

The present invention relates to a boron nitride containing evaporation vessel having deposited on its evaporation surface a titanium-iron-silicon base coating which is readily wetted by molten metals, such as molten aluminum, copper, silver, tin and the like. The present invention also relates to a method for applying a titanium-iron-silicon base coating to the surface of a boron nitride containing evaporation vessel.

BACKGROUND OF THE INVENTION

It is common practice to metallize or coat various articles fashioned from such diverse materials as steel, rubber, plastic and the like by vapor depositing aluminum thereon.

In practice, the actual coating or metallizing or an article is carried out in a vacuum chamber which contains both the metal to be vaporized and, in a spaced apart relationship, the article or web to be coated or metallized. Generally, the metal to be vaporized is deposited at a controlled rate into the refractory vessel or crucible, which is at a temperature sufficient to cause the metal to become molten and commence to vaporize.

In the foregoing general process it is essential that a vessel or crucible be employed which does not react substantially with the molten metal such as aluminum. This requirement is exceptionally well satisfied by fashioning such a vessel or crucible from a refractory material such as boron nitride or a boron nitride base composite. However, one difficult which is experienced with the use of this type of material is slow or limited wetting of the boron nitride base evaporation vessel by molten metal such as aluminum during the start up of the metallizing apparatus. This delay in wetting reduces the total efficiency of the metallizing process and is to be avoided, if possible.

U.S. Pat. No. 3,724,996 discloses a boron nitride-containing vaporization vessel having deposited on its surface a zirconium-silicon alloy that is applied by reacting a portion of the zirconium-silicon alloy with the contacted boron nitride containing vessel at elevated temperatures.

U.S. Pat. No. 3,730,507 discloses a boron nitride containing vaporization vessel having deposited on its surface a titanium silicon alloy in which the coating had been formed by reacting a portion of the titanium silicon base alloy with the contacted boron nitride portion of the vessel at elevated temperatures.

In using the boron nitride containing vessels to vaporize aluminum, each vessel acts as a resistive heater, a container for the molten aluminum, and a surface for the aluminum to vaporize from. Although the prior art vessels perform well, the novel coating of this invention permits lower temperature wetting by aluminum, improved vessel life, immediate stabilization of a new boat at a uniform vaporization rate, uniform wear of the vessel, and uniform metal deposition on the web. The delay in wet-in of a vessel reduces the overall efficiency of the metallizing process. In some instances an operator could overheat the vessel to get as quick a wet-in as possible and then if he continued to run the process at this higher temperature, the life of the vessel could be shortened.

It is an object of the present invention to provide a boron nitride containing vessel with a novel coating that will enable the vessel to be used with molten metals, such as aluminum, in various vaporizing processes.

It is another object of the present invention to provide a boron nitride containing evaporation vessel with a titanium-iron-silicon base coating that is readily wetted by molten metals, such as molten aluminum.

It is another object of the present invention to provide a boron nitride containing vessel with a titanium-iron-silicon base coating that enables the vessel to be used efficiently in vaporizing aluminum for packaging, capacitor film and solar/microwave film applications.

The foregoing and additional objects will become more apparent from the description and disclosure hereinafter.

SUMMARY OF THE INVENTION

Broadly stated the invention relates to a vessel comprising boron nitride, preferably with a compatible refractory material, and wherein said vessel has at least a portion of its surfaces coated with a layer of titanium-iron-silicon.

The invention also relates to a method of coating a refractory boron nitride containing evaporation vessel with a titanium-iron-silicon coating comprising the steps:

(a) blending together titanium powders, iron powders and silicon powders to form a dry blend;

(b) mixing the dry blend of step (a) with a liquid vehicle, dispersant and binder to form a slurry in which the solid particles of the powders are preferably from 65 to 80 weight percent of the slurry;

(c) coating the surface of the vessel with the slurry of step (b) and (d) heating the coated surface of the vessel to remove the liquid portion of the slurry and cure the binder, preferably at an elevated temperature of about 100° C. for at least 2 hours. A desirable range for carrying out this heating step is 95° C.–105° C. for 1 to 2.5 hours. Temperatures above 105° C. may degrade some types of binders.

The liquid vehicle is the medium in which the powder particles are suspended. Suitable liquid vehicles are methylethylketone, alcohols, water or inorganic liquids which will dissolve the binder. The dispersant contributes to uniformity of powder distribution throughout the slurry and may act as an anti-settling agent. Suitable dispersants are butanol gel, hydroxyethyl cellulose, siloxanes, polyether alcohol and the like.

The evaporation vessel could comprise boron nitride and refractory material selected from the group consisting of titanium diboride, aluminum nitride, titanium nitride, calcium fluoride, calcium oxide and mixtures thereof.

Preferably the evaporation vessel may be fabricated either from commercially pure boron nitride or from a refractory composite material which contains a substantial amount of boron nitride. In practice, it is preferred to employ a refractory composite which contains at least 20 weight percent boron nitride. Good results have been obtained by employing a vessel containing all boron nitride or one containing from about 20 to about 80 weight percent boron nitride with the remainder being a compatible refractory material such as titanium diboride. The titanium diboride is added to the boron nitride base material to render the resultant article electrically conductive, if such is desired. However, it should be noted that refractory materials other than titanium diboride may be employed in the practice of the instant invention as discussed above.

The titanium-iron-silicon dry blend for use in preparing the coating on the evaporation vessel could comprise a blend of 45 to 75 weight percent titanium powders, 18 to 35 weight percent iron powders, and 7 to 20 weight percent silicon powders. The preferred dry blend would comprise about 59 weight percent titanium, about 28 weight percent iron and about 13 weight percent silicon.

The powder size of the titanium, iron and silicon has to be sufficient to provide a substantially homogeneous mixture and preferably can be 100 Tyler mesh and smaller. More preferably, the powders should be about 325 Tyler mesh or smaller.

The dry blend should be mixed with a liquid vehicle, dispersant, and binder to form a slurry that can be applied to the surface of the evaporation vessel. Preferably, the solid particles or powders of the slurry should be at least 65 weight percent of the slurry so as to provide as little porosity in the final coating as is feasible. Preferably, the solid particle content of the slurry should be from 65 to 80 weight percent of the slurry. Most preferably, about 75 weight percent solids.

The vehicle, dispersant and binder for use in preparing the slurry can be two or more materials. Suitable liquids for forming the slurry could be methylethylketone (MEK) as the liquid vehicle with polyvinylacetate (PVA) as the dispersant and binder. Butanol gel may be added to improve dispersion and prolong shelf life.

The slurry can be applied to the surface of the evaporation vessel by brushing or spraying. A powder composition could be applied by flame spraying, plasma spraying or other suitable techniques. If applied in the liquid state, such as painting or spraying, the coated vessel is then heated to dry to remove the liquid portion of the slurry and cure the binder leaving the titanium-iron-silicon layer on the surface of the vessel. The heating of the vessel can be done at an elevated temperature of about 100° C., preferably above 95° C., for a time sufficient to substantially remove the liquid portion of the slurry and cure the binder.

It should be noted that an advantage afforded by the aforementioned slurry technique is that it enables one to more easily coat irregularly shaped vessels.

DESCRIPTION OF DRAWING

The sole FIGURE shown in the drawing presented herewith is an isometric illustration of a rectangular vessel or crucible of the type commonly employed in a conventional vacuum metallizing apparatus.

Referring now to the drawing in detail, there is shown an isometric illustration of an evaporation vessel 1 having a cavity therein designated by the numeral 2. The floor of the cavity 2 constitutes the evaporation surface of the vessel 1 and is coated with a titanium-iron-silicon base alloy 4 which is mechanically bonded thereto. The evaporation vessel 1 is formed of a boron nitride base refractory material 3.

EXAMPLE

A rectangular vessel of the type shown in the drawing 6½ inches long by 1½ inches in width by one-half inch in height having a cavity therein of approximately 3 cubic inches was fashioned from a composite refractory material comprising 50 weight percent boron nitride, with the remainder being essentially titanium diboride.

A dry blend of 59.1 weight percent titanium powder, 27.6 weight percent iron powder and 13.3 weight percent silicon powder, all sized to pass through a 325 Tyler mesh, were wet ball milled for four hours in methylethylketone with a polyvinylacetate addition as a dispersant/binder to produce a slurry. The polyvinylacetate was premixed with the methylethylketone in a paint shaker before the dry blend was added. The polyvinylacetate was 3.1 weight percent of the liquid portion of the slurry.

The resultant slurry having about 75 weight percent particles or powders was then brushed onto the surface of the cavity of the vessel which had previously been cleaned by sandblasting. Sandblasting also roughens the surface and improves coating bond. The coating covered the surface of the cavity so that the surface of the cavity could not be seen.

The coated vessel was then dried at 100° C. for two hours. After drying, the vessel was put in the metallizer and run. When vaporizing aluminum, it is preferred to place aluminum wires on the cavity before startup. This will enable the operator to find the lowest possible wetting temperature so that the temperature can be increased to the minimum operating conditions for the amount of aluminum (grams/minute) to be vaporized.

The vessel so prepared was then used as an aluminum evaporation vessel in a conventional evaporation apparatus. It was noted that the aluminum wet the vessel immediately between 900° and 1,000° C. as compared to 1,350° to 1,500° C. for an uncoated vessel. It was also observed that the wetting action is gentle for the subject coated vessel whereas the wetting action was violent for an uncoated vessel.

In another example, a similar composition to that described above was prepared but the polyvinylacetate content was 6.2 weight percent of the liquid portion of the slurry. Butanol gel, an anti-settling agent, was also added in an amount equal to 2 weight percent of the total slurry. Performance of a coated vessel was equivalent to that described above.

It was also observed that the subject coating did not appear to vaporize significantly up to 1,700° C. The titanium-silicon alloy coating of the prior art vaporizes at about 1500° C.

The term evaporation as used herein and in the appended claim is means to describe the surface of the evaporation vessel which is wetted by the metal to be evaporated. It is clear to those skilled in the art that this surface generally is the floor of the cavity provided in the evaporation vessel. However, it should be noted that this surface may also include the side walls of the evaporation vessel. In addition, it should be noted that it may not be necessary to coat the entire evaporation surface with a titanium-iron-silicon mixture to realize the benefits of the instant invention. Accordingly, the instant invention is meant to include boron nitride base evaporation vessels wherein the whole as well as a portion of the evaporation surface thereof is coated with a titanium-iron-silicon coating.

From the foregoing, it will be readily appreciated by those skilled in the art that vessels produced according to the instant invention are not only ideally suited for use as evaporation vessels for aluminum in a conventional metallizing apparatus, but that they may also find utility as vessels for molten aluminum and other metals in other metal handling processes.

Accordingly, the example presented herein is for illustrative purposes only and is not intended to unduly limit the reasonable scope of the instant invention.

What is claimed:

1. An evaporation vessel comprising boron nitride, said vessel having at least a portion of its surface coated with a titanium-iron-silicon layer.

2. The evaporation vessel of claim 1 wherein the titanium-iron-silicon layer comprises from 45 to 75 weight percent titanium, from 18 to 35 weight percent iron and from 7 to 20 weight percent silicon.

3. The evaporation vessel of claim 1 wherein the titanium-iron-silicon layer comprises about 59 weight percent titanium, about 28 weight percent iron and about 13 weight percent silicon.

4. The evaporation vessel of claim 1, 2 or 3 wherein the evaporation vessel further comprises a refractory material selected from the group consisting of titanium diboride, aluminum nitride, titanium nitride, calcium fluoride, calcium oxide, and mixtures thereof.

5. The evaporation vessel of claim 1 wherein said evaporation vessel comprises 20 to 80 weight percent boron nitride with the remainder being essentially titanium diboride.

6. The evaporation vessel of claim 5 wherein said evaporation vessel comprises 50 weight percent boron nitride with the remainder being essentially titanium diboride.

7. The evaporation vessel of claim 5 wherein the titanium-iron-silicon layer comprises about 59 weight percent titanium, about 28 weight percent iron and about 13 weight percent silicon.

8. The evaporation vessel of claim 1, 5 or 7 wherein said vessel is rectangularly shaped and has a cavity disposed on a portion of its longitudinal and lateral surface which extends into said vessel for a portion of its depth.

* * * * *